(12) United States Patent
Lee et al.

(10) Patent No.: US 7,076,707 B2
(45) Date of Patent: Jul. 11, 2006

(54) METHODOLOGY OF LOCATING FAULTS OF SCAN CHAINS IN LOGIC INTEGRATED CIRCUITS

(75) Inventors: Juinn Lee, Hsinchu (TW); Chin-pin Jen, Taipei (TW); Ming-chang Yang, Hsinchu (TW); Hung-chieh Chen, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 490 days.

(21) Appl. No.: 10/401,701

(22) Filed: Mar. 31, 2003

(65) Prior Publication Data

US 2004/0181722 A1   Sep. 16, 2004

(51) Int. Cl.
*G01R 31/28* (2006.01)

(52) U.S. Cl. ............................ 714/726; 714/30; 714/25

(58) Field of Classification Search ................ 714/726, 714/25, 30
See application file for complete search history.

(56) References Cited

U.S. PATENT DOCUMENTS

| | | | | | |
|---|---|---|---|---|---|
| 5,550,841 | A | * | 8/1996 | O'Brien | 714/724 |
| 5,570,376 | A | * | 10/1996 | Kunda et al. | 714/736 |
| 5,831,992 | A | * | 11/1998 | Wu | 714/732 |
| 6,490,702 | B1 | * | 12/2002 | Song et al. | 714/726 |
| 6,553,329 | B1 | * | 4/2003 | Balachandran | 702/118 |
| 6,865,706 | B1 | * | 3/2005 | Rohrbaugh et al. | 714/738 |

* cited by examiner

*Primary Examiner*—Albert Decady
*Assistant Examiner*—Esaw Abraham
(74) *Attorney, Agent, or Firm*—Jiang Chyun IP Office

(57) ABSTRACT

For a plurality of logic integrated circuits, initial value vectors associated with flip-flops are retrieved from each of corresponding scan chain sets. The initial value vectors of the same corresponding scan chain set are compared with each other so as to identify elements with fixed values in the initial value vectors. When the total number of the elements with fixed values reaches a predetermined percentage, the elements having fixed values are selected as a golden pattern of the corresponding scan chain set. During the testing, an initial value vector of a scan chain of a logic integrated circuit to be tested is compared with the golden pattern associated with the scan chain, so as to determine whether a faulty flip-flop exists in the scan chain of the logic integrated circuit to be tested.

7 Claims, 5 Drawing Sheets

| Scan Chain No. | No. of Flip-Flop | No. of Elements with a Fixed Value of Logic 1 | No. of Elements with a Fixed Value of Logic 0 | No. of Elements with Fixed Values | Percentage |
|---|---|---|---|---|---|
| A | 1045 | 501 | 483 | 984 | 94.2% |
| B | 900 | 380 | 478 | 858 | 95.3% |
| C | 2000 | 1120 | 725 | 1845 | 92.3% |
| ⋮ | ⋮ | ⋮ | ⋮ | ⋮ | ⋮ |

Fig. 5

| Flip-Flop No. | ... | 50 | 51 | 52 | 53 | 54 | 55 | 56 | 57 | 58 | 59 | ... |
|---|---|---|---|---|---|---|---|---|---|---|---|---|
| Initial Value Vector of a Scan Chain to Be Tested | ... | 0 | 0 | 0 | 0 | 1 | 1 | 1 | 1 | 0 | 0 | ... |
| Golden Pattern Associated with the Scan Chain to Be Tested | ... | 1 | 1 | 1 | 1 | 1 | 1 | 1 | 1 | 0 | 0 | ... |

Fig. 6

METHODOLOGY OF LOCATING FAULTS OF SCAN CHAINS IN LOGIC INTEGRATED CIRCUITS

BACKGROUND OF THE INVENTION

1. Field of the Invention

The present invention relates to methodology of locating faults in logic integrated circuits and, more particularly, to methodology of locating faults of scan chains in logic integrated circuits.

2. Description of the Related Art

In order to satisfy performance demands of computers, communications, and consumer electronics, the semiconductor industry starts developing technology related to integrating an entire, complicated system onto a single chip. Along with continuous progress of the semiconductor processing technology, a single chip is able to accommodate more and more logic gates. It is expected that such a technical innovation trend will continue until the nearest future. As a result of the dramatic increase of the complication level on the chip, it is more difficult to analyze possible faults existing in the chip.

In the testing of a logic integrated circuit, scanning is a very effective design for test, having very high fault coverage. The testing mode is executed without interfering normal operations of the logic integrated circuits. Scan chains consisting of series-connected flip-flops are utilized to detect the faults in the integrated circuits. Hereinafter is described in brief a method of analyzing faults in a logic integrated circuit by the scanning method with reference to FIG. 1.

A logic integrated circuit 1 includes a number of functional circuit modules 13. In order to test the logic integrated circuit 1, a plurality of scan chains 121, 122, and 123 are designed therein. The scan chains 121, 122, and 123 consist of series of flip-flops 1211, 1221, and 1231, respectively. Each of the flip-flops 1211, 1221, and 1231 is connected to a corresponding one of the functional circuit modules 13. During the testing, each of the functional circuit modules 13 transfers a value of logic 0 or logic 1 to the correspondingly connected one of the flip-flops 1211 of the scan chain 121. Next, the series of flip-flops 1211 output a testing sequence 1212 one digit by one digit. Similarly, the scan chains 122 and 123 output the testing sequences 1222 and 1232, respectively. Each of the testing sequences 1212, 1222, and 1232 is compared with a predetermined correct sequence for identifying any inconsistence in each of the testing sequences 1212, 1222, and 1232. With reference to the compared result, the faults in the logic integrated circuit 1 can be located.

For the above-mentioned method of analyzing faults, a reset circuit 11 must be provided in the logic integrated circuit 1 for setting the initial states of the flip-flops as either logic 0 states or logic 1 states, usually as logic 0 states. Along with the increase of the chip complication level, the number of the scan chains must be added in order to effectively locate the faults of the functional circuit modules 13. Therefore, the number of the reset circuits also increases along with the increase of the scan chains. Some of the reset circuits have special functions. However, some of the reset circuits are merely for the purpose of resetting the initial states of the flip-flops. Such reset circuits inevitably occupy certain area of the chip, causing that the chip size reduction is restricted and the chip yield per wafer is suppressed.

SUMMARY OF THE INVENTION

In view of the above-mentioned problem, an object of the present invention is to provide a method of locating faults of scan chains in logic integrated circuits, capable of effectively reducing areas of chips.

Another object of the present invention is to provide a method of locating faults of scan chains in logic integrated circuits, capable of enhancing the chip yield per wafer.

According to one aspect of the present invention, a method of locating a fault of a scan chain in a logic integrated circuit includes an initial value collecting step, a golden pattern determining step, and a fault locating step.

The initial value collecting step retrieves a plurality of initial value vectors of the flip-flops with respect to each corresponding scan chain set by using a plurality of logic integrated circuits with a same configuration as a statistical population.

The golden pattern determining step compares each of the initial value vectors in the same corresponding scan chain set with each other in order to identify elements of the initial value vectors with fixed values, wherein the elements with the fixed values are selected as a golden pattern for the corresponding scan chain set when the number of the elements with the fixed values reaches a predetermined percentage.

The fault locating step compares initial values of a scan chain of a logic integrated circuit to be tested with the golden pattern associated with the scan chain to be tested in order to determine whether the scan chain to be tested has at least one faulty flip-flop.

With the method of locating faults of scan chains in a logic integrated circuit according to the present invention, the logic integrated circuit needs not to be provided with the reset circuit, thereby effectively reducing the chip area and enhancing the chip yield per wafer. In addition, the positions of the faults can be determined with a high accuracy.

BRIEF DESCRIPTION OF THE DRAWINGS

The above-mentioned and other objects, features, and advantages of the present invention will become apparent with reference to the following descriptions and accompanying drawings, wherein:

FIG. 5 shows a step of determining golden patterns according to the present invention; and FIG. 6 shows a step of locating faults according to the present invention.

DETAILED DESCRIPTION OF THE PREFERRED EMBODIMENTS

The preferred embodiments according to the present invention will be described in detail with reference to the drawings.

Figure 1:
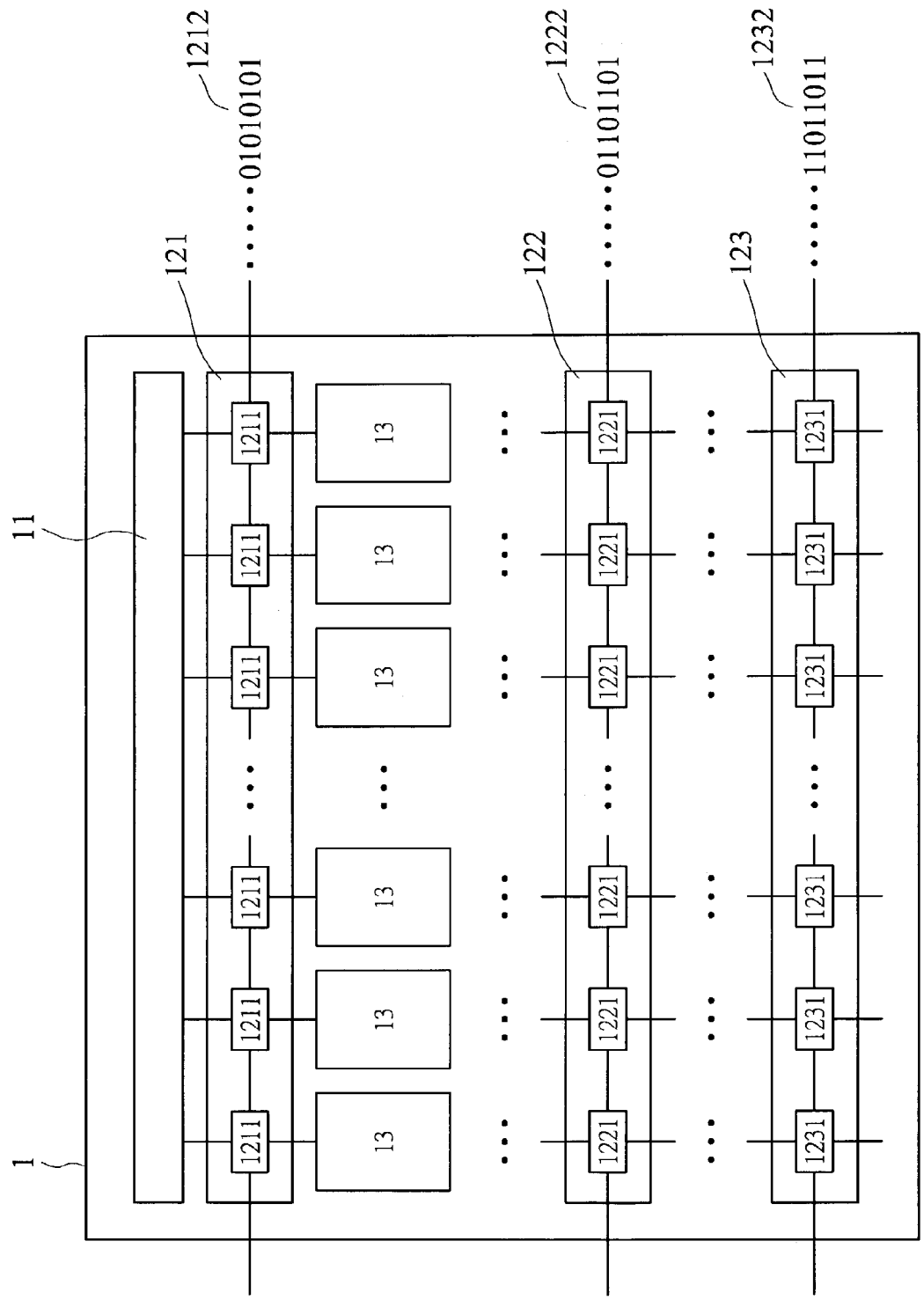
FIG. 1 is a schematic diagram showing a configuration of a conventional logic integrated circuit.
Figure 2:
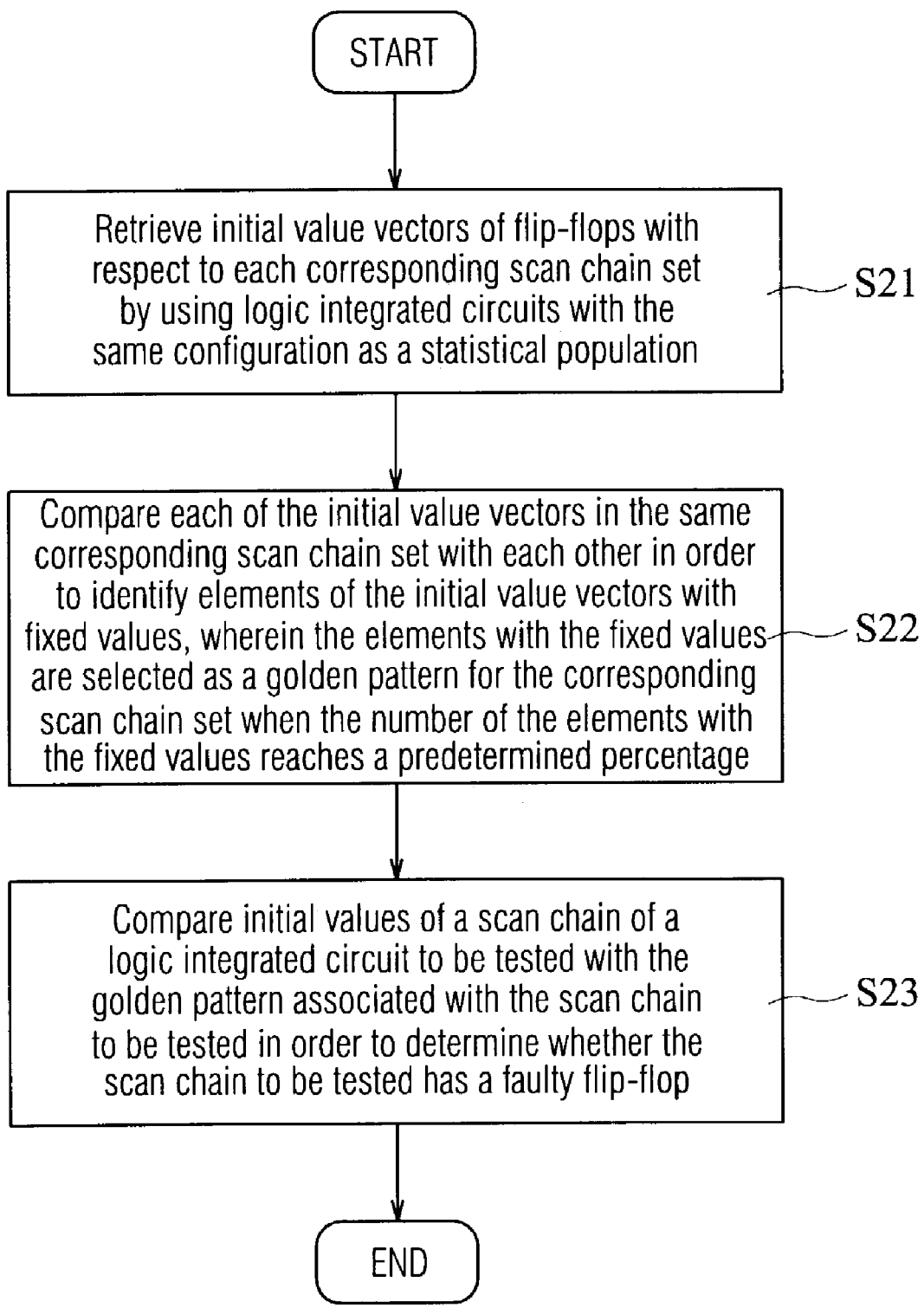
FIG. 2 is a flow chart showing a method of locating faults of scan chains in logic integrated circuits according to the present invention.

Referring to FIG. 2, a method of locating faults of scan chains in a logic integrated circuit according to the present invention includes an initial value collecting step S21, a golden pattern determining step S22, and a fault locating step S23. The logic integrated circuit includes at least a scan chain, each of which consists of a plurality of flip-flops connected in series.

Figure 3:
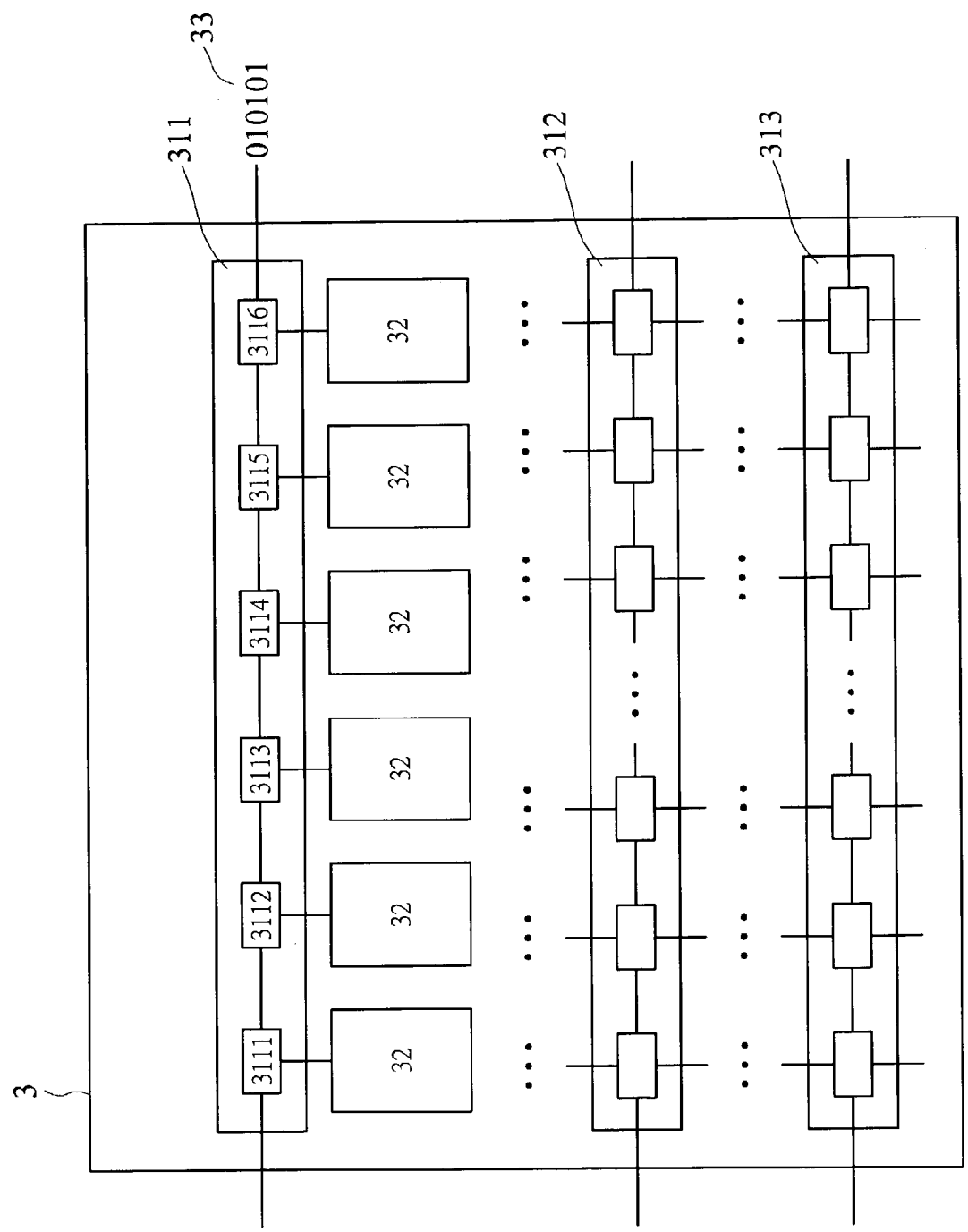
FIG. 3 is a schematic diagram showing a configuration of a logic integrated circuit according to the present invention.

The initial value collecting step S21 is performed to retrieve initial values of the flip-flops with respect to each of corresponding scan chain sets, which are formed in a plurality of logic integrated circuits with the same configuration. That is, the plurality of logic integrated circuits with the same configuration serve as a statistical population. The corresponding scan chain set indicates a set of scan chains with the same configuration but separately formed in different logic integrated circuits. For example, as shown in FIG. 3, a logic integrated circuit 3 among the statistical population includes a plurality of scan chains 311, 312, and 313 and a plurality of functional circuit modules 32. The scan chain 311 consists of six flip-flops 3111, 3112, 3113, 3114, 3115, and 3116. Initial values of the flip-flops 3111, 3112, 3113, 3114, 3115, and 3116 are read out of the logic integrated circuit 3 in accordance with the period of a scanning clock (not shown). For example, the initial values of the flip-flops 3111, 3112, 3113, 3114, 3115, and 3116 in the scan chain 311 is output through the flip-flop 3116 in accordance with the period of the scanning clock. In this case, the initial value of the flip-flop 3116 is output at first, and then the initial values of the flip-flops 3115, 3114, 3113, 3112, and 3111 follow up to be output one by one in this order. For example, as shown in FIG. 3, the initial value vector 33 of the scan chain 311 is 010101, representing a sequence of the initial values of the flip-flops 3111, 3112, 3113, 3114, 3115, and 3116 in the scan chain 311. Similarly, after a period of time determined by the number of the flip-flops of the scan chain 312 (or 313), the initial value vector of the scan chain 312 (or 313) can be obtained.

Figure 4:
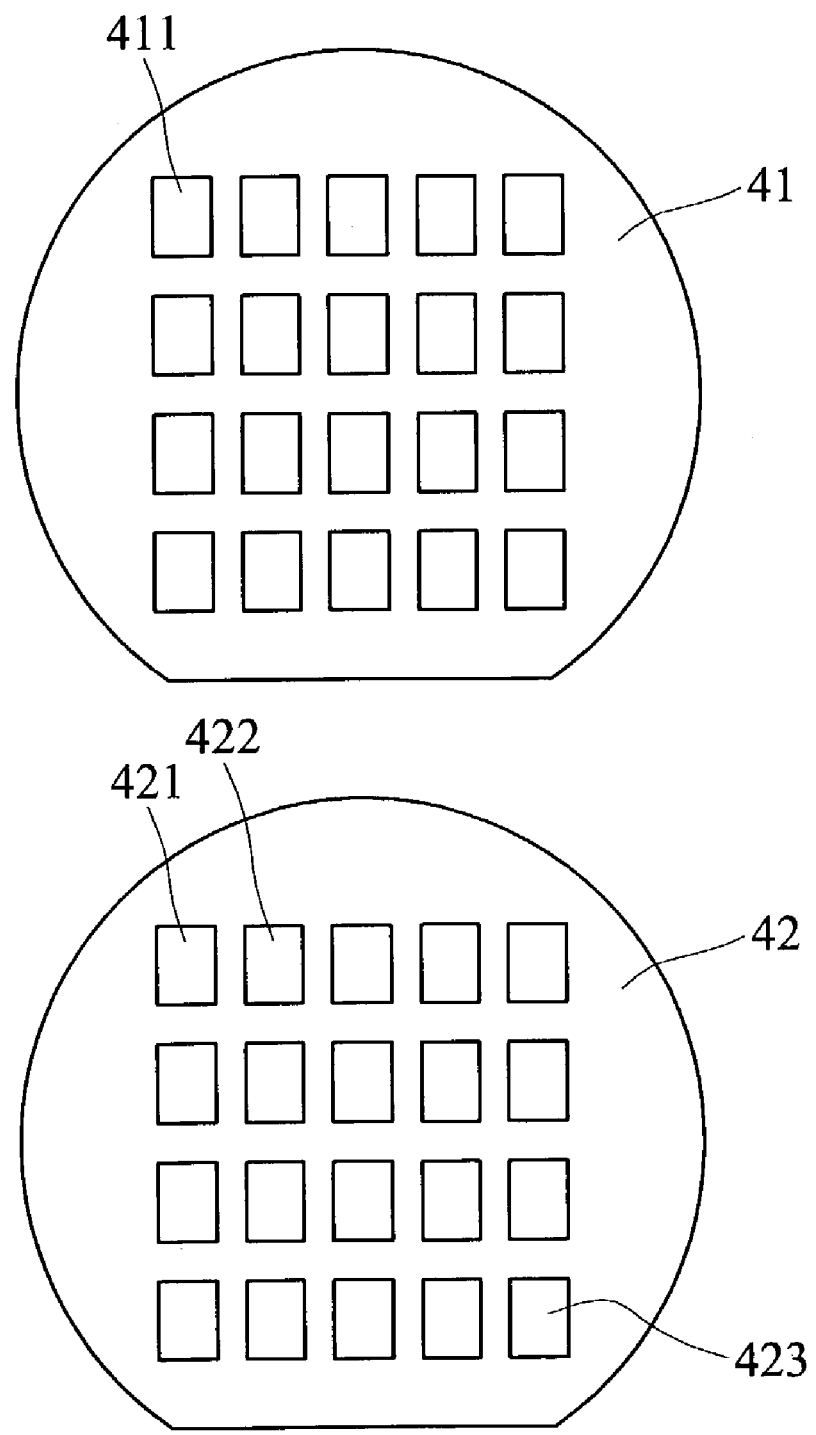
FIG. 4 is a schematic diagram showing logic integrated circuits, which are statistical samples, distributed over a single wafer and different wafers.

As described above, a plurality of logic integrated circuits with the same configuration are used as the statistical population in the present invention. For example, each of rectangular blocks shown in FIG. 4 refers to each of the logic integrated circuits with the same configuration. The logic integrated circuits with the same configuration may be formed on different wafers, such as a chip 411 on a wafer 41 and a chip 421 on a wafer 42, or formed at different positions on a common wafer, such as chips 421, 422, and 423 on the wafer 42. The scan chains in the logic integrated circuits with the same configuration may be classified into a plurality of corresponding scan chain sets. The initial value collecting step S21 retrieves an initial value vector with respect to each scan chain in each rectangular block, and then arranges together the initial value vectors retrieved from a common corresponding scan chain set for facilitating the following steps.

The golden pattern determining step S22 is performed to identify the elements with fixed values (logic 0 or logic 1) by comparing the initial value vectors, which are collected during the initial value collecting step, in the same corresponding scan chain set with each other. Theoretically, all of the initial value vectors in the same corresponding scan chain set should be equal to each other. However, not all of the initial value vectors are equal to each other because of inevitable variations of processing during the integrated circuit manufacturing. Consequently, the golden pattern determining step S22 identifies, by a normal statistical method, the positions and total number of the elements with fixed values in the initial value vectors for each of the corresponding scan chain sets. When the number of the elements with fixed values reaches a significant level in statistics, these elements with fixed values can be selected as a good representative of the initial value vector of the scan chain. Hereinafter the representative initial value vector is referred to as the golden pattern.

The fault locating step S23 is performed to compare initial values of a scan chain in a logic integrated circuit to be tested with a golden pattern associated with the scan chain, thereby determining whether the scan chain has faulty flip-flops therein. If the scan chain in the logic integrated circuit is determined to have faulty flip-flops, the fault locating step S23 can simultaneously point out the positions of the faulty flip-flops.

The method of locating faults of scan chains in a logic integrated circuit according to the present invention will be more apparently understood from the following embodiment. As shown in FIG. 5, assume that a logic integrated circuit includes scan chains A, B, and C, which consist of 1045, 900, and 2000 flip-flops, respectively. According to the present invention, the initial value collecting step is performed at first, by an automatic test equipment, to collect initial value vectors of the flip-flops in the scan chains A, B, and C from a plurality of logic integrated circuits with the same configuration.

Next, in accordance with the golden pattern determining step, each of the initial value vectors in the same corresponding scan chain set is compared with each other for identifying elements with fixed values (logic 0 or logic 1) in the initial value vectors. Taking the scan chain A of FIG. 5 for example, in the corresponding scan chain set of the scan chain A, the number of the elements with a fixed value of logic 1 in the initial value vectors is 501, and the number of the elements with a fixed value of logic 0 is 483. Therefore, the total number of the elements with fixed values is 984, which is 94.2% (=984/1045×100%) of all the elements of the initial value vector in the scan chain A. If a criterion to selecting a golden pattern is set as that the number of the elements with fixed values is larger than 90% of all the elements, then the golden pattern of the scan chain A is obtained. Similarly, golden patterns of the scan chains B and C are determined in the same way.

During the fault locating step, initial value vectors of scan chains in a logic integrated circuit to be tested is collected by the automatic test equipment at first. Next, the collected initial value vectors are compared with the corresponding golden patterns, respectively, thereby determining whether each of the scan chains has faulty flip-flops. For example, one of the initial value vectors and the corresponding golden pattern are partially shown in FIG. 6. As clearly seen from FIG. 6, with respect to the $54^{th}$ to $59^{th}$ flip-flops, the collected initial values of the scan chain are the same as the corresponding part of the golden pattern. However, with respect to the $50^{th}$ to $53^{rd}$ flip-flops, the collected initial values of the scan chain are different from the corresponding part of the golden pattern. More specifically, all of the collected initial values of the $50^{th}$ to $53^{rd}$ flip-flops in the scan chain are logic 0. It is therefore considered that the initial value of the $53^{rd}$ flip-flop is incorrectly transferred to the $54^{th}$ flip-flop with some kind of mistake, causing that the initial values of the $50^{th}$ to $53^{rd}$ are changed to logic 0 when passing through the $54^{th}$ flip-flop.

To further find out the reason that the faults occur, the layout of the logic integrated circuit is referred to, starting from a connection path between the $53^{rd}$ and $54^{th}$ flip-flops outwardly to all metal wirings with a potential equal to the connection path.

With the method of locating faults of scan chains in a logic integrated circuit according to the present invention, the logic integrated circuit needs not to be provided with the reset circuit, thereby effectively reducing the chip area and enhancing the chip yield per wafer. In addition, the positions of the faults can be determined with a high accuracy.

Although the above-mentioned embodiment uses the criterion that 90% of all the elements have a fixed value for selecting the golden pattern. However, any person skilled in the art can change the criterion to 80% or 99% depending on the condition or stability of the processing or the design of the logic integrated circuit.

While the invention has been described by way of examples and in terms of preferred embodiments, it is to be understood that the invention is not limited to the disclosed embodiments. To the contrary, it is intended to cover various modifications. Therefore, the scope of the appended claims should be accorded the broadest interpretation so as to encompass all such modifications.

What is claimed is:

1. A method of locating at least one a fault of a scan chain having a plurality of flip-flops in a logic integrated circuit of a configuration, comprising:

an initial value collecting step of randomly selecting a plurality of logic integrated circuits with the same configuration, retrieving a plurality of initial value vectors of the flip-flops of every scan chain within said logic integrated circuits, and grouping together said initial value vectors into a plurality of corresponding scan chain sets, wherein said scan chain set contains scan chains with the same configuration:

a golden pattern determining step of comparing each of the initial value vectors in the same corresponding scan chain set with each other to identify elements of the initial value vectors with fixed values and selecting the elements with the fixed values as a golden pattern for the corresponding scan chain set when the number of said elements reaches a predetermined percentage; and a fault locating step of comparing a plurality of initial values of a scan chain in question of a logic integrated circuit with the golden pattern found for the corresponding scan chain set that contains scan chains of the same configuration as the scan chain in question to determine whether the scan chain in question has at least one faulty flip-flop.

2. The method according to claim 1, wherein the initial value vector is constructed by a sequence of data stored in the plurality of flip-flops, each of the data being logic 0 or logic 1.

3. The method according to claim 1, wherein the initial value collecting step is performed by using an automatic test equipment.

4. The method according to claim 1, wherein the initial values of the scan chain in question are collect by using an automatic test equipment.

5. The method according to claim 1, wherein the fault locating step further comprises: locating the at least one faulty flip-flop when the scan chain in question is determined to have the at one faulty flip-flop.

6. The method according to claim 1, wherein the fault locating step further comprises: finding out at least one faulty position with reference to a layout of the logic integrated circuit containing the scan chain in question when the scan chain in question is determined to have the at least one faulty flip-flop.

7. The method according to claim 1, wherein the at least one faulty flip-flop is caused by a fault located in a range covering all metal wirings associated with the at least one faulty flip-flop.

* * * * *